(12) United States Patent
Lee et al.

(10) Patent No.: US 8,212,266 B2
(45) Date of Patent: Jul. 3, 2012

(54) LIGHT EMITTING DEVICE AND METHOD OF FABRICATING THE SAME

(75) Inventors: Sang-moon Lee, Suwon-si (KR); Young-soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 142 days.

(21) Appl. No.: 12/662,845

(22) Filed: May 6, 2010

(65) Prior Publication Data
US 2011/0114915 A1    May 19, 2011

(30) Foreign Application Priority Data

Nov. 17, 2009 (KR) .................. 10-2009-0110923

(51) Int. Cl.
*H01L 33/00* (2010.01)

(52) U.S. Cl. .............. 257/88; 257/288; 257/E21.053; 257/E21.126; 257/E21.127; 257/E21.17; 257/E21.229; 257/E21.278; 257/E21.352

(58) Field of Classification Search .............. 257/88, 257/199, 200, 201, 288, 289, 309, E21.053, 257/E21.126, E21.127, E21.17, E21.229, 257/E21.278, E21.352
See application file for complete search history.

(56) References Cited

U.S. PATENT DOCUMENTS

| 6,283,812 | B1 | 9/2001 | Jin et al. | |
| 6,864,162 | B2* | 3/2005 | Jin | 438/551 |
| 7,459,839 | B2* | 12/2008 | Tolt | 313/310 |
| 2004/0108298 | A1 | 6/2004 | Gao | |
| 2007/0003472 | A1* | 1/2007 | Tolt | 423/447.3 |
| 2009/0183770 | A1 | 7/2009 | Nguyen | |

FOREIGN PATENT DOCUMENTS

| EP | 1 755 137 | 8/2005 |
| WO | WO03/088361 | 10/2003 |
| WO | WO2006/086074 | 8/2006 |

* cited by examiner

*Primary Examiner* — David Nhu
(74) *Attorney, Agent, or Firm* — Harness, Dickey & Pierce, P.L.C.

(57) ABSTRACT

A light emitting device may include a plurality of nano-structures having a strip shape, each including a first nano-structure and a second nano-structure, the first nano-structures being the same height on the buffer layer.

11 Claims, 6 Drawing Sheets

LIGHT EMITTING DEVICE AND METHOD OF FABRICATING THE SAME

CROSS-REFERENCE TO RELATED APPLICATIONS

This application claims priority under U.S.C. §119 to Korean Patent Application No. 10-2009-0110923, filed on Nov. 17, 2009, in the Korean Intellectual Property Office, the entire contents of which are incorporated herein by reference.

BACKGROUND

1. Field

Example embodiments relate to a light emitting device and a method of fabricating the same, and more particularly, to a light emitting device including strip nano-structures and a method of fabricating the same.

2. Description of the Related Art

In general, a gallium nitride (GaN) light emitting device (light emitting diode (LED)) may be formed by sequentially stacking an n-type GaN layer, an InGaN active layer, and a p-type GaN layer on a sapphire substrate. In the stacked film type GaN LED, a severe threading dislocation may be caused by a lattice mismatch due to the physical properties of GaN or a method of growing GaN. Therefore, the brightness and reliability of the stacked film type GaN LED may be limited. In addition, the stacked film type GaN LED may have disadvantages, e.g., low light emitting efficiency, wide spectrum, and large output variation.

In order to address these disadvantages of the stacked film type LED, nano-scale LEDs having a p-n junction formed by strip nano-structures may have been fabricated recently. However, in these nano-scale LEDs, if the height of the nano-structures may be not constant, a p-type electrode material may be most likely deposited on an n-type semiconductor material, which may cause a large leakage current.

SUMMARY

Example embodiments provide a light emitting device including strip nano-structures and a method of fabricating the same. Additional aspects will be set forth in part in the description which follows and, in part, will be apparent from the description, or may be learned by practice of example embodiments.

According to example embodiments, a light emitting device may include a substrate; a buffer layer on the substrate; a plurality of nano-structures having a strip shape, including a plurality of first nano-structures located on an upper surface of the buffer layer and a plurality of second nano-structures located on upper surfaces of the plurality of first nano-structures; insulating layers between the plurality of the nano-structures; a transparent conductive material layer covering the plurality of nano-structures and the insulating layers; a first electrode on the buffer layer; and a second electrode on the transparent conductive material layer, and the plurality of first nano-structures on the buffer layer may have the same height.

The insulating layers may be formed to be higher than the upper surfaces of the plurality of first nano-structures. The plurality of nano-structures may further include active layers between the plurality of first nano-structures and the plurality of second nano-structures. The insulating layers may be formed to be higher than upper surfaces of the active layers.

The plurality of second nano-structures on the plurality of first nano-structures may have substantially the same height.

The plurality of nano-structures may be formed integrally with the buffer layer. The plurality of nano-structures may be nanorods or nanowires. The plurality of nano-structures may be perpendicular to the buffer layer.

The plurality of first nano-structures may be made of an n-type semiconductor material and the plurality of second nano-structures may be made of a p-type semiconductor material. The plurality of first nano-structures may be made of a p-type semiconductor material and the plurality of second nano-structures may be made of an n-type semiconductor material. The insulating layers may be made of a transparent spin on glass (SOG), silicon dioxide ($SiO_2$), or an epoxy resin.

According to example embodiments, a method of fabricating a light emitting device may include forming a buffer layer on a substrate; forming a plurality of first nano-structures having a strip shape on the buffer layer; forming first insulating layers between the plurality of first nano-structures; planarizing upper surfaces of the plurality of first nano-structures and the first insulating layers; growing a plurality of second nano-structures on upper surfaces of the plurality of first nano-structures; forming second insulating layers between the plurality of second nano-structures; forming a transparent conductive material layer so as to cover the plurality of second nano-structures and the second insulating layers; and forming a first electrode and a second electrode on the buffer layer and the transparent conductive material layer, respectively.

The plurality of first nano-structures may be grown from an upper surface of the buffer layer by a vapor-liquid-solid (VLS) method or a selective area growth (SAG) method. The plurality of first nano-structures and the first insulating layers may be planarized by a chemical mechanical polishing (CMP) operation.

Forming the first electrode may include etching the transparent conductive material layer, the plurality of first and second nano-structures, the first and second insulating layers, and the buffer layer to expose a part of the buffer layer; and forming the first electrode on the exposed part of the buffer layer.

According to example embodiments, a method of fabricating a light emitting device may include forming a semiconductor material layer on a substrate; providing an etching mask having nano-patterns on the semiconductor material layer; forming a plurality of first nano-structures of strip shapes by etching the semiconductor material layer to a depth through the etching mask; forming first insulating layers to fill spaces between the plurality of first nano-structures; growing a plurality of second nano-structures on upper surfaces of the plurality of first nano-structures; forming second insulating layers to fill spaces between the plurality of second nano-structures; forming a transparent conductive material layer covering the plurality of second nano-structures and the second insulating layers; and forming a first electrode and a second electrode on the semiconductor material layer and the transparent conductive layer, respectively.

The plurality of first nano-structures of strip shapes including p-type or n-type semiconductor material may be formed to the same height on the buffer layer via the planarization process. In addition, the light emitting device may be fabricated by using the nano-structures of the same height so that the p-type electrode and the n-type semiconductor material or the n-type electrode and the p-type semiconductor material may be insulated efficiently from each other, and thus improving a light emitting efficiency.

BRIEF DESCRIPTION OF THE DRAWINGS

Example embodiments will be more clearly understood from the following detailed description taken in conjunction with the accompanying drawings.

FIGS. 1 through 7 are diagrams illustrating a method of fabricating a light emitting device according to example embodiments; and FIGS. 8 through 12 are diagrams illustrating a method of fabricating a light emitting device according to example embodiments.

DETAILED DESCRIPTION

Figure 1:
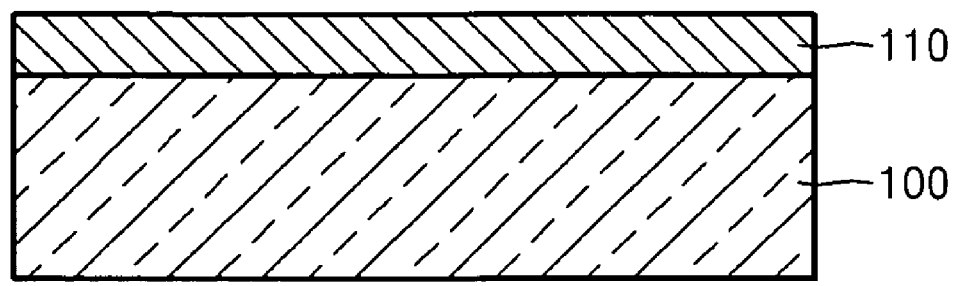
FIGS. 1-12 represent non-limiting; example embodiments as described herein.

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description. It should be noted that these Figures are intended to illustrate the general characteristics of methods, structure and/or materials utilized in certain example embodiments and to supplement the written description provided below.

These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 7 are diagrams illustrating a method of fabricating a light emitting device according to example embodiments. Referring to FIG. 1, a substrate 100 may be prepared. The substrate 100 may be, for example, a sapphire substrate. However, example embodiments are not limited thereto, and other various substrates may be used. In addition, a buffer layer 110 may be formed on an upper surface of the substrate 100. The buffer layer 110 may be formed of a p-type semiconductor material or an n-type semiconductor material. For example, the buffer layer 110 may be formed of n-GaN.

Figure 2:
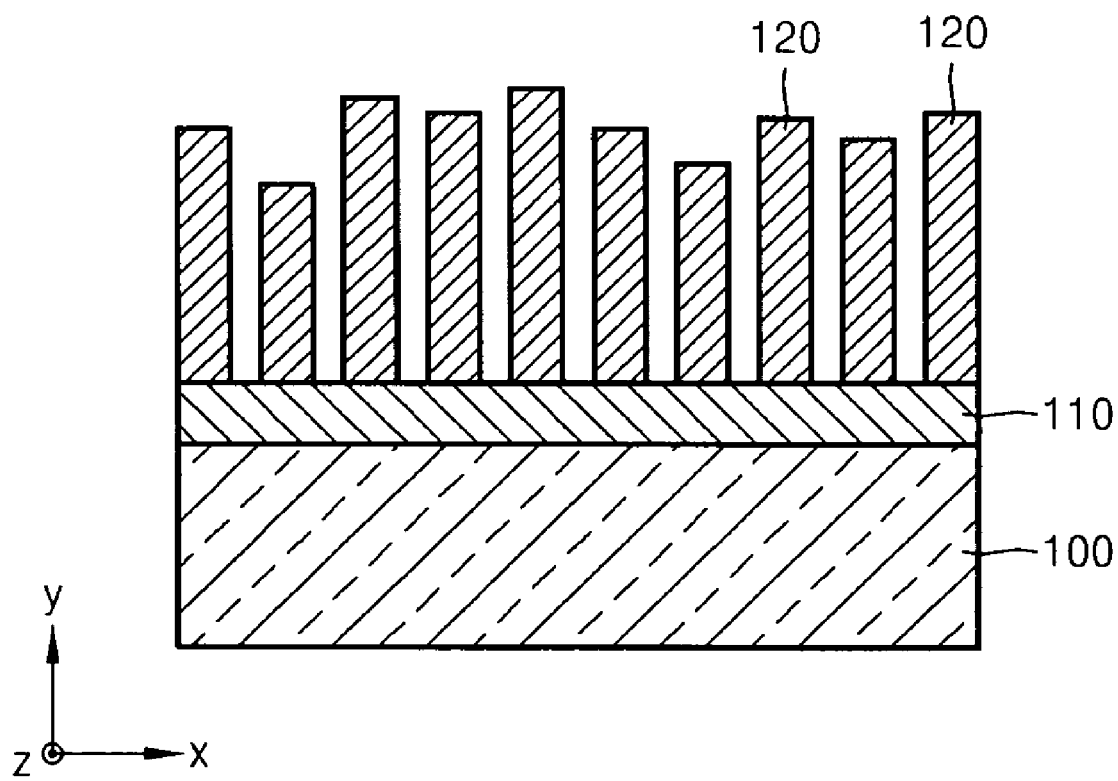

Referring to FIG. 2, a plurality of first nano-structures 120 may be formed on an upper surface of the buffer layer 110. The plurality of first nano-structures 120 may have a strip, linear and/or one-dimensional shape. In other words, the first nano-structures 120 may be formed to extend in a vertical direction along the y-axis from the buffer layer 110, where the first nano-structures 120 are greater in length along the y-axis and shorter in length along the x-axis and z-axis. For example, the first nano-structures 120 may be nanorods or nanowires. The first nano-structures 120 may be formed of a p-type semiconductor material or an n-type semiconductor material. For example, if the buffer layer 110 is formed of n-GaN, the first nano-structures 120 may be formed of n-GaN. The plurality of first nano-structures 120 may be grown on the upper surface of the buffer layer 110 by a vapor-liquid-solid (VLS) method using a metal catalyst or by a selective area growth (SAG) method using a mask. During growing, the plurality of nano-structures 120 may have different heights according to growing states thereof. The first nano-structures 120 may be grown perpendicular to the buffer layer 110.

Figure 3:
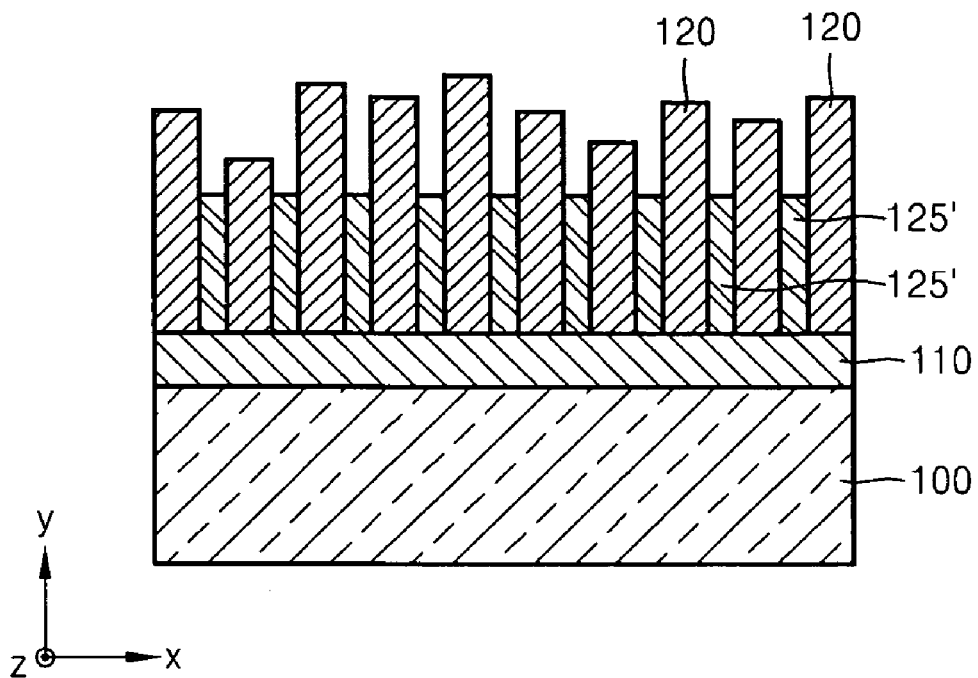

Referring to FIG. 3, first insulating layers 125' may be formed between the first nano-structures 120. The first insulating layers 125' may be formed of a transparent insulating material which may fill spaces between the first nano-structures 120 and may sustain heat in following post-processes. The first insulating layers 125' may be formed of, for example, transparent spin on glass (SOG), $SiO_2$, or an epoxy resin. However, example embodiments are not limited thereto.

Figure 4:
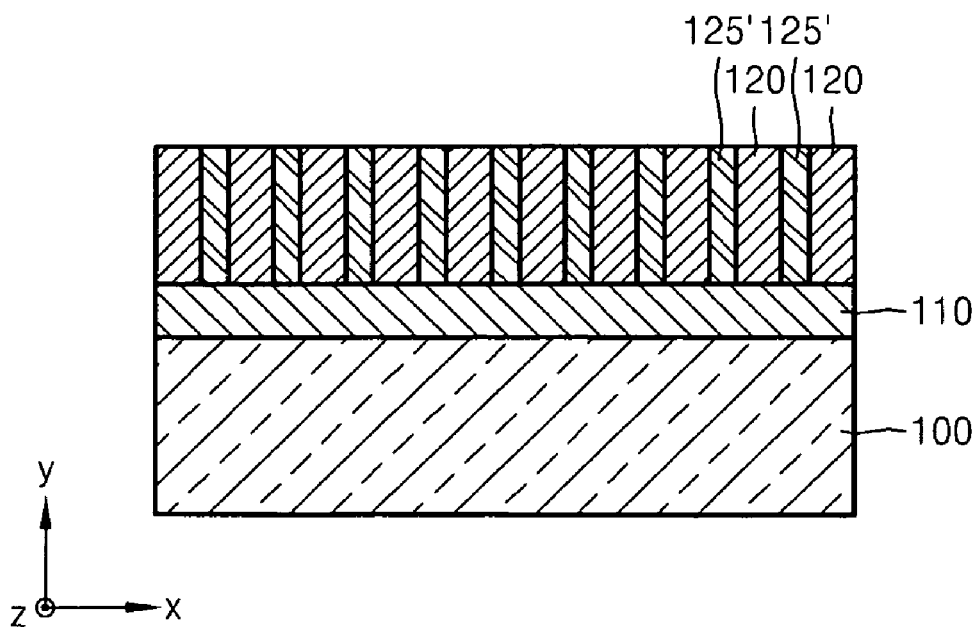

Referring to FIG. 4, upper surfaces of the first nano-structures 120 and the first insulating layers 125' may be planarized through a planarization process. The planarization of the first nano-structures 120 and the first insulating layers 125' may be performed through a chemical mechanical polishing (CMP) process. Through the above planarization process, the first nano-structures 120 may have the same height on the buffer layer 110.

Figure 5:
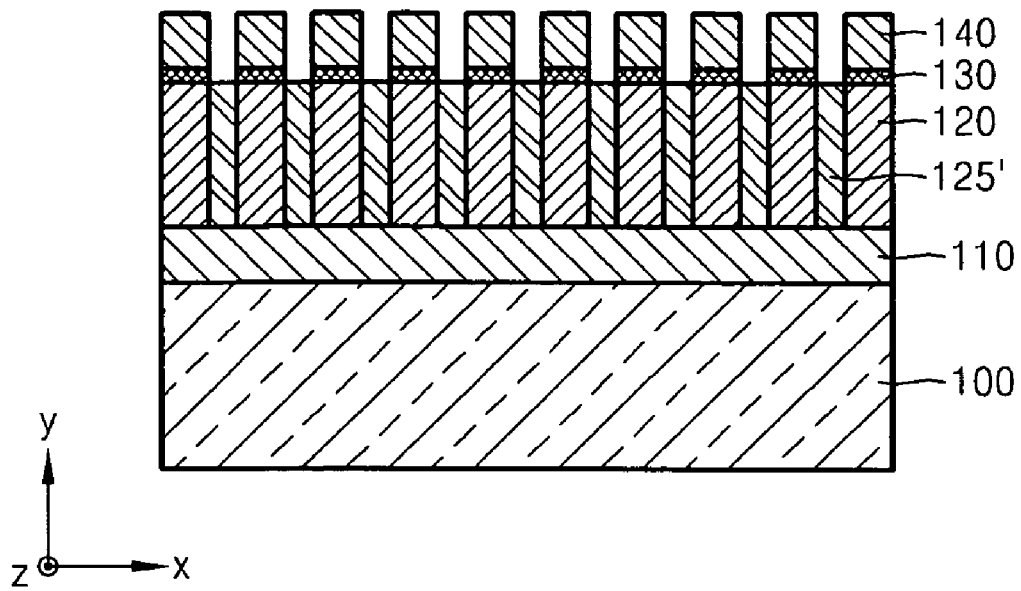

Referring to FIG. 5, active layers 130 and second nano-structures 140 may be sequentially grown on upper surfaces of the first nano-structures 120. The active layers 130 and the second nano-structures 140 may be grown by the SAG method by using the first insulating layers 125' as a mask. Accordingly, the second nano-structures 140 may have a strip shape as the first nano-structures 120. The second nano-structures 140 may be formed of an n-type semiconductor material or a p-type semiconductor material. For example, if the first nano-structures 120 are formed of n-GaN, the second nano-structures 140 may be formed of p-GaN. The active layers 130 may be formed of InGaN; however, example embodiments are not limited thereto. The second nano-structures 140 may be grown to have the same height on the upper surfaces of the first nano-structures 120 by adjusting a growing time of the second nano-structures 140. Accordingly, nano-structures including the first nano-structures 120, the active layers 130, and the second nano-structures 140 may be formed to have the same height on the buffer layer 110. In example embodiments, the nano-structure may include the first nano-structures 120, the active layers 130, and the second nano-structures 140. However, the nano-structure may include only the first nano-structures 120 and the second nano-structures 140 to form p-n junctions.

Figure 6:
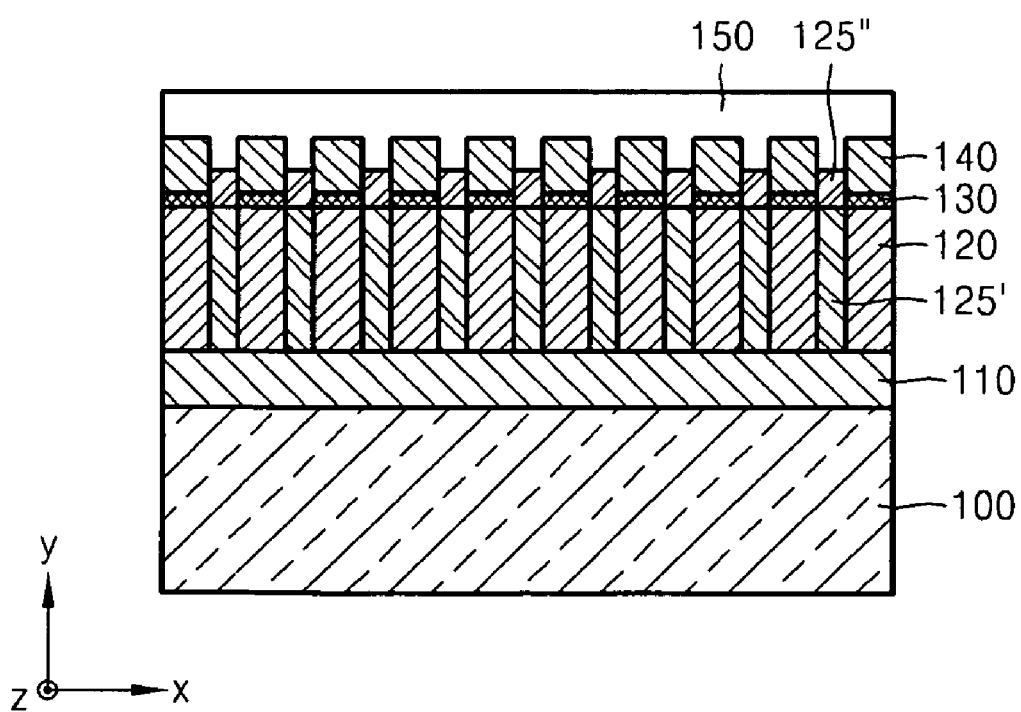

Referring to FIG. 6, second insulating layers 125'' may be formed between the second nano-structures 140. The second insulating layers 125'' may be formed of the same material as the first insulating layers 125', for example, transparent SOG, $SiO_2$, or an epoxy resin. Accordingly, insulating layers including the first and second insulating layers 125' and 125'' may be filled between the nano-structures. In addition, the insulating layers may be higher than upper surfaces of the active layers 130 in order to insulate a second electrode (160 of FIG. 7) that will be described later and the first nano-structures 120. On the other hand, when the nano-structures only include the first nano-structures 120 and the second nano-structures 140, the insulating layers may be formed to be higher than the upper surfaces of the first nano-structures 120.

In addition, a transparent conductive material layer 150 may be formed to cover the second nano-structures 140 and the second insulating layers 125''. The transparent conductive material layer 150 may supply electric current uniformly to all nano-structures. The transparent conductive material layer 150 may be formed as a layer combining an Ni thin film and an Au thin film; however, example embodiments are not limited thereto.

Figure 7:
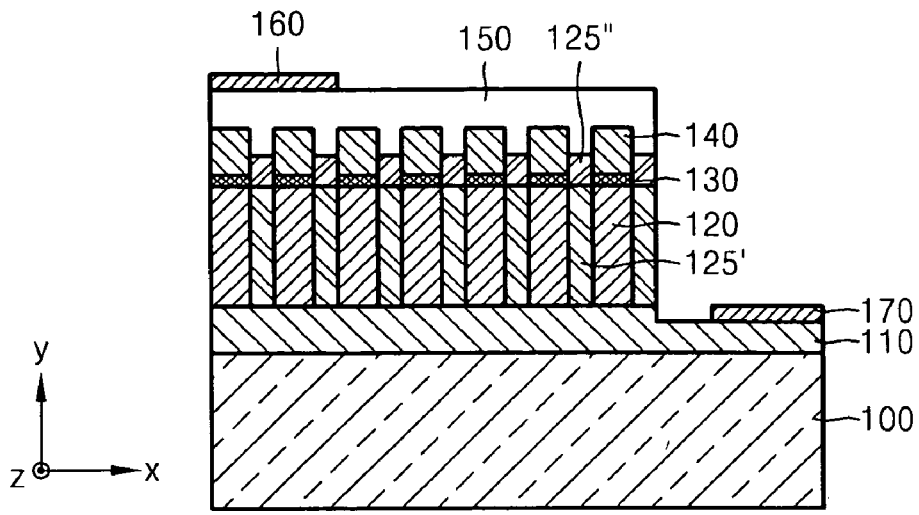

Referring to FIG. 7, the transparent conductive material layer 150, the first and second nano-structures 120 and 140, the active layers 130, the first and second insulating layers 125' and 125'', and the upper portion of the buffer layer 110 may be etched to expose a part of the buffer layer 110. In addition, a first electrode 170 may be formed on the exposed buffer layer 110, and the second electrode 160 may be formed on the transparent conductive material layer 150 to complete the LED. When the buffer layer 110 is formed of the n-type semiconductor material and the second nano-structures 140 is formed of the p-type semiconductor material, the first and second electrodes 170 and 160 may be respectively an n-type electrode and a p-type electrode. On the other hand, when the buffer layer 110 is formed of the p-type semiconductor material and the second nano-structures 140 are formed of the n-type semiconductor material, the first and second electrodes 170 and 160 may be the p-type electrode and the n-type electrode, respectively. In the above described structure, when a voltage is applied to the first and second electrodes 170 and 160, electrons and holes discharged from the first and second nano-structures 120 and 140 may be combined in the active layers 130, thereby light being generated. The generated light passes through the first and second insulating layers 125' and 125'' and the transparent conductive material layer 150 and may be emitted out of the LED.

In example embodiments, the first nano-structures 120 may have a strip shape and the same height on the buffer layer 110. In addition, because the insulating layers are formed between the nano-structures to be higher than the upper surfaces of the active layers 130 or the upper surfaces of the first nano-structures 120, the second electrode 160 and the first nano-structures 120 may be effectively insulated from each other. Accordingly, a leakage current may be prevented or reduced from occurring, and the light emitting efficiency of the LED may be improved.

Figure 8:
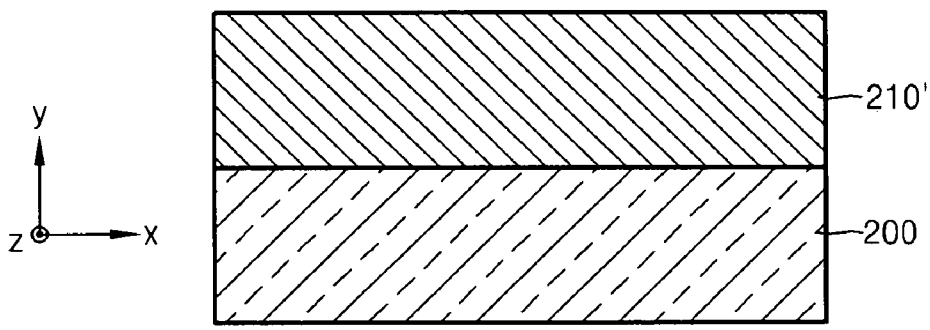

FIGS. 8 through 12 are cross-sectional views illustrating a method of fabricating an LED according to example embodiments. Hereinafter, only components which may be different from the example embodiments illustrated in FIGS. 1-7 will be described. Referring to FIG. 8, a predetermined or given semiconductor material layer 210' may be formed on a substrate 200. The semiconductor material layer 210' may be formed of a p-type semiconductor material or an n-type semiconductor material. For example, the semiconductor material layer 210' may be formed of GaN.

Figure 9:
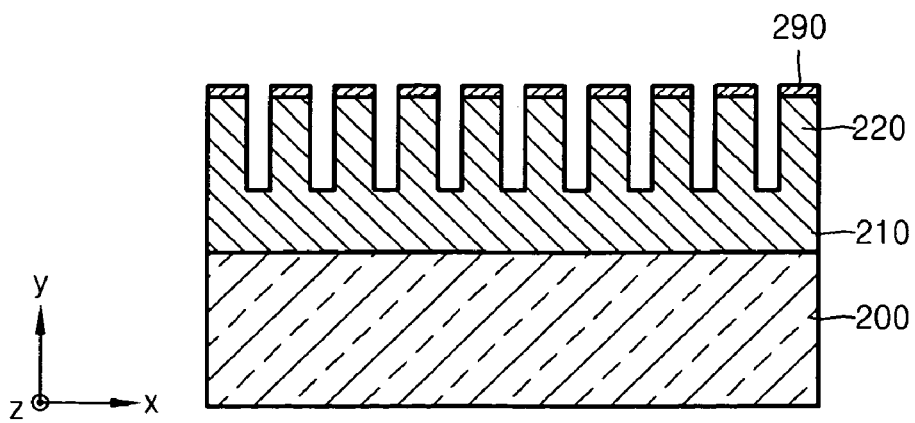

Referring to FIG. 9, an etching mask 290 including nano-patterns may be disposed on an upper surface of the semiconductor material layer 210'. In addition, the semiconductor material layer 210' may be etched to a predetermined or given depth by using the etching mask 290. Accordingly, the etched upper portion of the semiconductor material layer 210' forms a plurality of first nano-structures 220 having a strip shape, and a lower portion of the semiconductor material layer 210' may form a buffer layer 210. Through the above etching process, the buffer layer 210 and the first nano-structures 220 may be formed integrally with each other. That is, the first nano-structures 220 and the buffer layer 210 may be formed of the same material of the semiconductor material layer 210'.

The first nano-structures 220 and the buffer layer 210 may be formed of, for example, n-GaN. The first nano-structures 220 may be formed as nanorods or nanowires. According to the above described etching process, the first nano-structures of a strip shape may be formed to have the same height. In addition, the etching mask 290 remaining on the first nano-structures 220 may be removed.

Figure 10:
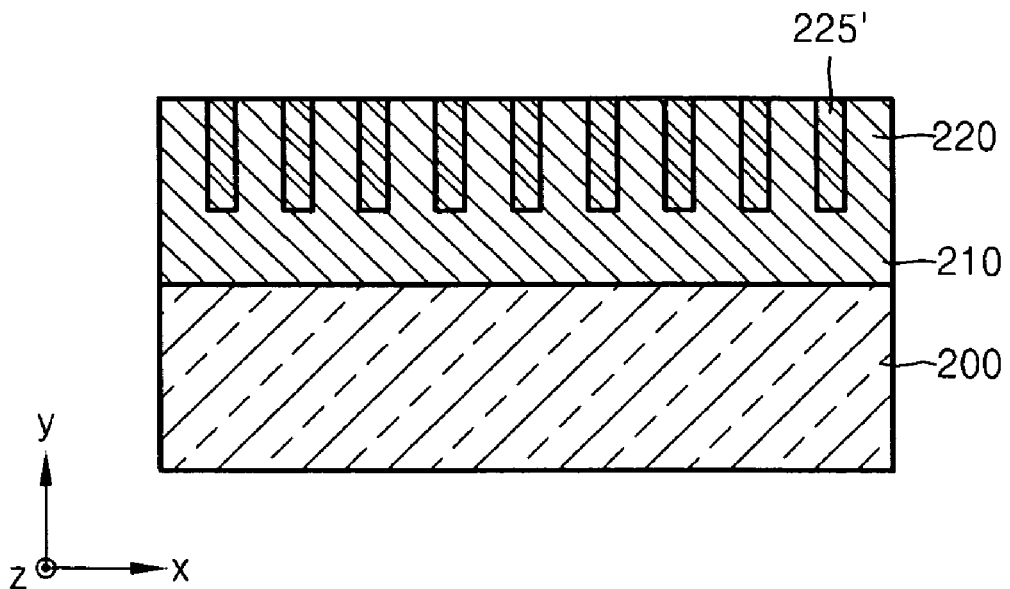

Referring to FIG. 10, first insulating layers 225' filling spaces between the first nano-structures 220 may be formed. The first insulating layers 225' may be formed to have the same height as the first nano-structures 220. The first insulating layers 225' may be formed of a transparent insulating material that fills the spaces between the first nano-structures 220 and may sustain heat in following post-processes. The first insulating layers 225' may be formed of, for example, transparent SOG, $SiO_2$, or an epoxy resin; however, example embodiments are not limited thereto.

Figure 11:
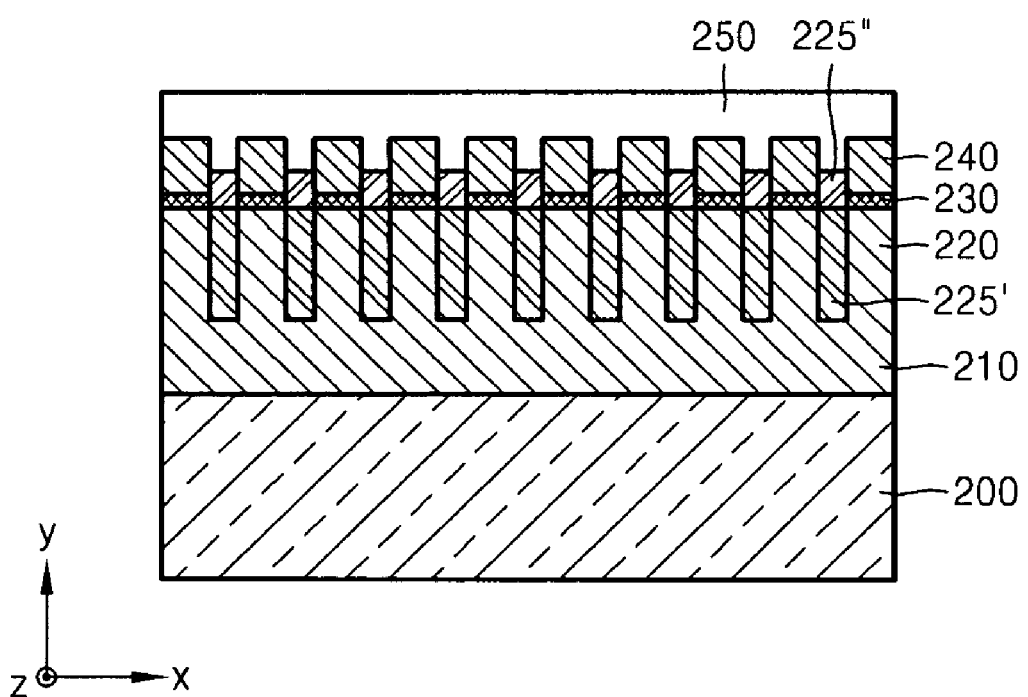

Referring to FIG. 11, active layers 230 and second nano-structures 240 may be sequentially grown on upper surfaces of the first nano-structures 220. The active layers 230 and the second nano-structures 240 may be grown by a SAG method using the insulating layers 225' as a mask. Accordingly, the second nano-structures 240 may also have a strip shape as the first nano-structures 220, and may be formed of an n-type semiconductor material and a p-type semiconductor material. For example, when the first nano-structures 220 are formed of n-GaN, the second nano-structures 240 may be formed of p-GaN. The active layers 230 may be formed of InGaN; however, example embodiments are not limited thereto.

On the other hand, the second nano-structures 240 may be grown to have the same height on the upper surfaces of the first nano-structures 220 by adjusting a growing time of the second nano-structures 240. Accordingly, nano-structures including the first nano-structures 220, the active layers 230, and the second nano-structures 240 may be formed to have the same height. In the above description, the nano-structures may include the first nano-structures 220, the active layers 230, and the second nano-structures 240, however, the nano-structures may include only the first nano-structures 220 and the second nano-structures 240 to form p-n junctions.

In addition, second insulating layers 225" may be formed between the second nano-structures 240. The second insulating layers 225" may be formed of the same material as the first insulating layers 225'. Accordingly, insulating layers including the first and second insulating layers 225' and 225" may be filled between the nano-structures. The insulating layers may be formed to be higher than upper surfaces of the active layers 230 in order to insulate a second electrode (260 of FIG. 12) that will be described later and the first nano-structures 220 from each other. If the nano-structures only include the first nano-structures 220 and the second nano-structures 240, the insulating layers may be formed to be higher than upper surfaces of the first nano-structures 220.

A transparent conductive material layer 250 may be formed to cover the second nano-structures 240 and the second insulating layers 225". The transparent conductive material layer 250 may be a layer combining an Ni thin film and an Au thin film. However, example embodiments are not limited thereto, that is, various transparent conductive materials may be used to form the transparent conductive material layer 250.

Figure 12:
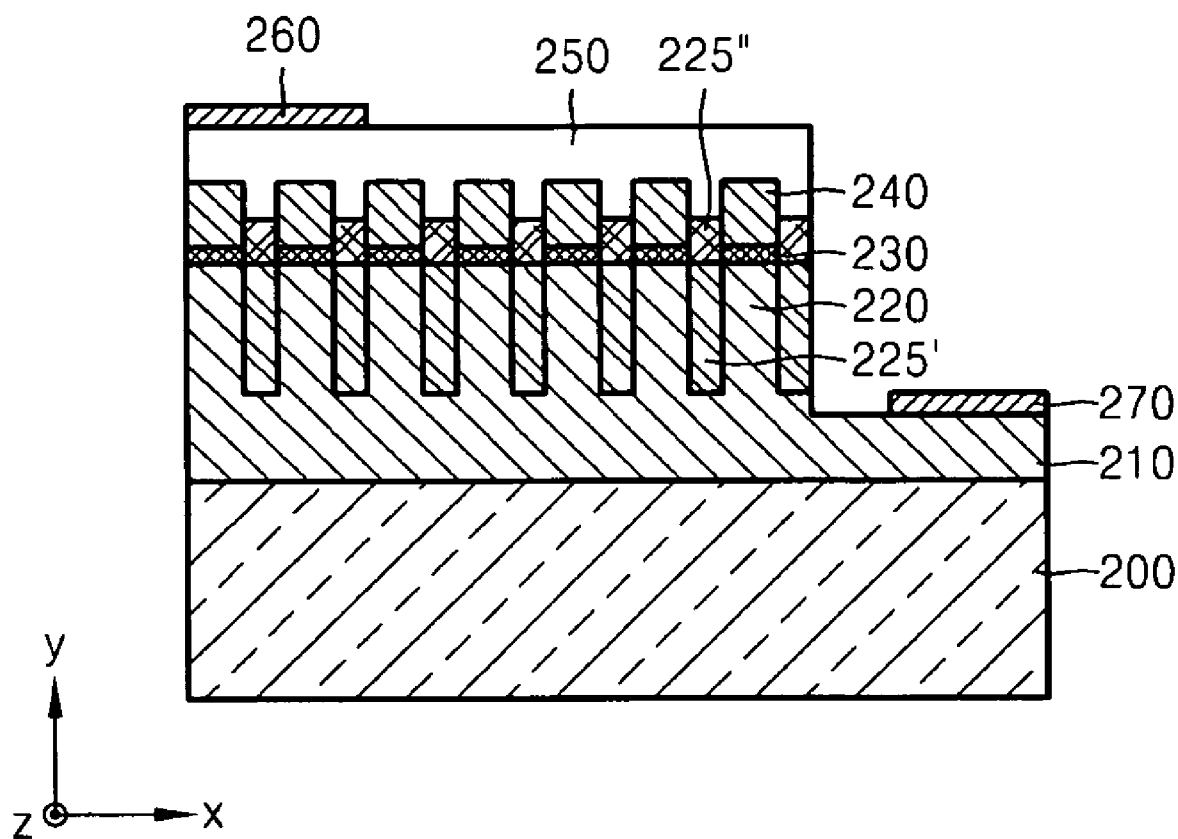

Referring to FIG. 12, the transparent conductive material layer 250, the first and second nano-structures 220 and 240, the active layers 230, the first and second insulating layers 225' and 225", and the upper portion of the buffer layer 210 may be etched to expose a part of the buffer layer 210. In addition, a first electrode 270 may be formed on the exposed part of the buffer layer 210, and the second electrode 260 may be formed on the transparent conductive material layer 250.

When the buffer layer 210 are formed of the n-type semiconductor material and the second nano-structures 240 are formed of the p-type semiconductor material, the first and second electrodes 270 and 260 may be an n-type electrode and a p-type electrode, respectively. On the other hand, when the buffer layer 210 is formed of the p-type semiconductor material and the second nano-structures 240 is formed of the n-type semiconductor material, the first and second electrodes 270 and 260 may be respectively the p-type electrode and the n-type electrode.

According to example embodiments, the first nano-structures 220 of a strip shape may be formed to have the same height through the etching process. In addition, because the insulating layers filled between the first nano-structures 220 are formed to be higher than the upper surfaces of the active layers 230 or the upper surfaces of the first nano-structures 220, the second electrode 260 and the first nano-structures 220 may be insulated efficiently from each other. Accordingly, a leakage current may be prevented or reduced from occurring, and a light emitting efficiency of the LED may be improved.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A light emitting device (LED) comprising:
    a substrate;
    a buffer layer on the substrate;
    a plurality of nano-structures having a strip shape, including a plurality of first nano-structures on an upper surface of the buffer layer and a plurality of second nano-structures on upper surfaces of the plurality of first nano-structures;
    insulating layers between the plurality of nano-structures;
    a transparent conductive material layer covering the plurality of nano-structures and the insulating layers;
    a first electrode on the buffer layer; and
    a second electrode on the transparent conductive material layer,
    wherein the plurality of first nano-structures on the buffer layer are the same height.

2. The light emitting device of claim 1, wherein the insulating layers are formed to be higher than the upper surfaces of the plurality of first nano-structures.

3. The light emitting device of claim 1, wherein the plurality of nano-structures further comprise:
    active layers between the plurality of first nano-structures and the plurality of second nano-structures.

4. The light emitting device of claim 3, wherein the insulating layers are formed to be higher than upper surfaces of the active layers.

5. The light emitting device of claim 1, wherein the plurality of second nano-structures on the plurality of first nano-structures have substantially the same height.

6. The light emitting device of claim 1, wherein the plurality of nano-structures are formed integrally with the buffer layer.

7. The light emitting device of claim 1, wherein the plurality of nano-structures are nanorods or nanowires.

8. The light emitting device of claim 1, wherein the plurality of nano-structures are perpendicular to the buffer layer.

9. The light emitting device of claim 1, wherein the plurality of first nano-structures are made of an n-type semiconductor material and the plurality of second nano-structures are made of a p-type semiconductor material.

10. The light emitting device of claim 1, wherein the plurality of first nano-structures are made of a p-type semiconductor material and the plurality of second nano-structures are made of an n-type semiconductor material.

11. The light emitting device of claim 1, wherein the insulating layers are made of a transparent spin on glass (SOG), silicon dioxide ($SiO_2$), or an epoxy resin.

* * * * *